United States Patent [19]

Mrazek

[11] 4,004,286
[45] Jan. 18, 1977

[54] PROGRAMMABLE RANDOM ACCESS MEMORY (PRAM) INTEGRATED CIRCUIT MEMORY DEVICE

[75] Inventor: Dale A. Mrazek, Los Altos Hills, Calif.

[73] Assignee: National Semiconductor Corporation, Santa Clara, Calif.

[22] Filed: Jan. 17, 1975

[21] Appl. No.: 541,781

[52] U.S. Cl. .................. 340/173 R; 340/173 CA
[51] Int. Cl.² ............................. G11C 11/40
[58] Field of Search ............. 340/173 CA, 173 R; 307/238, 304

[56] References Cited
UNITED STATES PATENTS

| | | | |
|---|---|---|---|
| 3,718,915 | 2/1973 | Lattin | 340/173 CA |
| 3,744,036 | 7/1973 | Bentchkowsky | 340/173 R |
| 3,855,581 | 12/1974 | Greene | 340/173 R |

OTHER PUBLICATIONS

Regitz et al., Three–Transistor–Cell 1024–Bit 500–ns MOS RAM, IEEE Journal of Solid–State Circuits, vol. SC–5, No. 5, Oct. 1970, pp. 181–186.
Davidson et al., Nonvolatile Read–Mostly Memory Cell, IBM Technical Disclosure Bulletin, vol. 15, No. 7, Dec. 1972, pp. 2282–2283.

*Primary Examiner*—Stuart N. Hecker
*Attorney, Agent, or Firm*—Lowhurst & Aine

[57] ABSTRACT

A novel integrated circuit memory cell structure where the individual cells in the storage matrix may be utilized as either a RAM type storage cell or a ROM type storage cell; this selective type storage cell is referred to as a programmable random access (PRAM). Each individual cell of the matrix comprises a write transistor, a read transistor, a RAM storage transistor, and a ROM floating gate storage transistor. Several different circuit arrangements for these four different transistors are shown in different embodiments of the invention.

2 Claims, 6 Drawing Figures

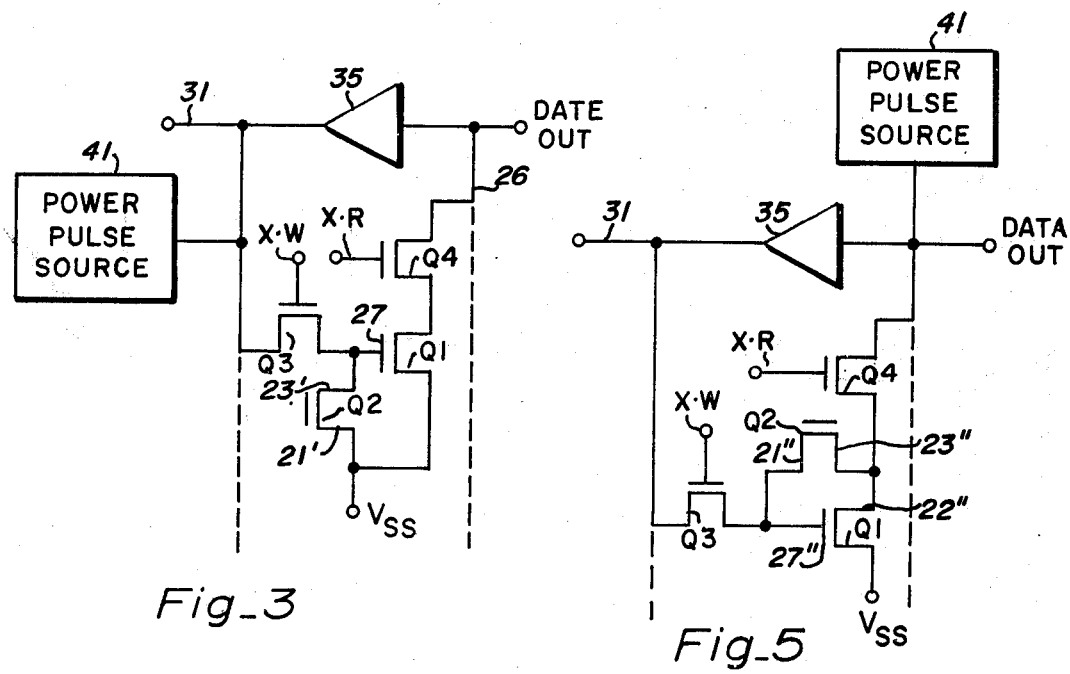
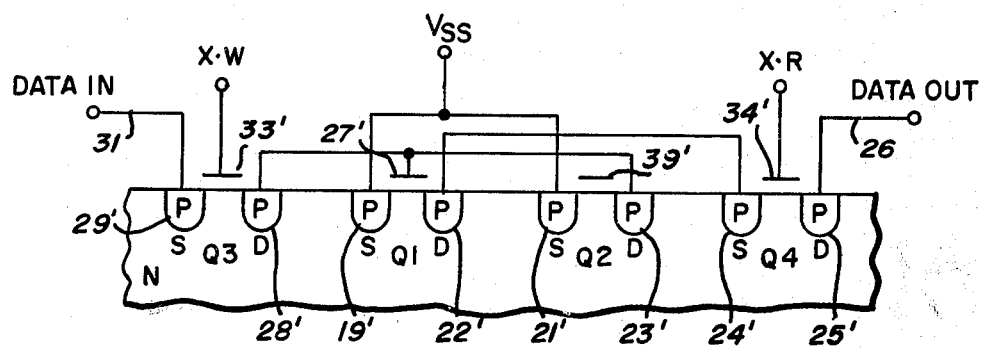
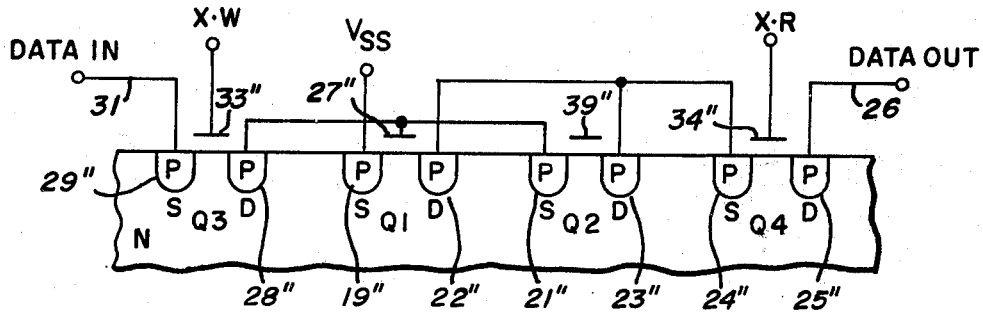

PROGRAMMABLE RANDOM ACCESS MEMORY (PRAM) INTEGRATED CIRCUIT MEMORY DEVICE

BACKGROUND OF THE INVENTION

In a standard form of well known integrated circuit random access memory (RAM) structure comprising a plurality of memory cells, for example 1024 memory cells in a 32 × 32 matrix, each memory cell includes three transistors, i.e., a storage transistor, a write transistor, and a read transistor. The drain to source circuit of the read transistor is connected in series with the drain to source circuit of the storage transistor and the drain to source circuit of the write transistor is connected to the gate of the storage transistor. With an X-select signal logically ANDED with a write signal and applied as a decode signal to the gate of the write transistor, the write transistor is turned on and establishes a low impedance input path from a charging voltage source to the gate of the storage transistor. This creates a stored charge in the inherent capacitor existing between the gate and the substrate region of the storage transistor, this stored charge at the gate node providing the desired memory storage in the form of a logic one or zero. With the turn-on signal removed from the gate of the write transistor, the charge will remain stored on this node for a suitable period of time, for example a 2 millisecond life time. This stored charge state may be read out from the storage transistor by an ANDED X-select and read signal applied to the gate of the read transistor, the read transistor thus being turned on and establishing a low impedance path from the drain to source circuit of the memory transistor to the date output line of the storage cell.

By establishing a stored charge in the gate circuit of the storage transistor in selected ones of the plurality of memory cells while omitting such a stored charge from the storage node of the storage transistors of the remaining cells, the programmed two logic states, i.e., a zero or a one, may be selectively stored in the memory structure.

Because of the two millisecond life time for the charge stored in the gate node of the storage transistor, it is necessary that the stored information be cyclically enhanced at least once within every two millisecond life time of the charge. For this purpose a feedback circuit is completed from th output of the memory cell via the read transistor and through a sense amplifier to the input circuit of the cell, i.e., to the drain to source circuit of the write transistor, and this circuit is established once within every such life time to re-enhance the storage charge on the gate node of the storage transistor. By thus cyclically re-enhancing the stored charges in the individual memory cells, e.g., once every 64 microseconds, the logic information stored in the memory structure may be maintained for long periods of time. The logic stored in any one cell within the multicell structure may be rapidly changed without affecting the other cells by writing a different signal input into the storage transistor of the one cell via the associated write transistor. Thus, the program stored in a memory cell array may be changed by changing the storage state of just one cell or any number of selected cells while retaining the remainder of the memory cells in their present logic state. Because of this ease of storage cell change, the dynamic RAM circuit lends itself readily to use in situations where slight modifications may be desired from time to time in a stored logic program. If, however, the power to the circuit should be interrupted even only momentarily, all of the logic information stored in the memory cells will be lost due to the inability to re-enhance the stored charges within the two millisecond life time.

Another well known form of integrated circuit matrix type memory cell structure is the non-volatile read only memory (ROM) which comprises a two transistor cell structure including a floating gate storage or memory transistor and a read-write transistor with its drain to source circuit connected in series with the drain to source circuit of the floating gate storage transistor. By applying a high voltage pulse via the drain to source circuit of the read-write transistor, which may be turned on by a logically ANDED select X and write signal applied to the gate thereof, to the drain to source circuit of the storage transistor, a charge may be stored in the floating gate of the storage transistor. This stored charge in the floating gate has a half-life time of 10 years and is thus, for all practical purposes, a permanent storage which need not be periodically enhanced as is the case with the RAM memory cell. The state of the storage transistor may be read out at any time by a decode signal comprising an X signal logically ANDED with a write signal applied to the gate of the write-read transistor which establishes a low impedance path between the drain to source circuit of the storage transistor and the output circuit of the memory cell. A typical program time for a ROM is about 100 milliseconds and the erase time for the memory structure using ultraviolet light is about five minutes. During the erase, all of the cells are erased simultaneously so that there is no selective erase and rewrite on one or more of the cells. Because of the long program time and the long erase time, as well as the bulk erase, the non-volatile ROM memory cell structure is not useful in applications where the stored program is desired only for short periods of time with minor changes to be made in the stored program at frequent time intervals. However, the ROM structure lends itself to use where power failures may be expected since the program stored on a ROM structure will remain intact even when the power to the circuit is interrupted.

SUMMARY OF THE PRESENT INVENTION

The present invention provides a novel integrated circuit memory cell structure in which the case of selectively changing the program stored therein as found in the dynamic RAM memory cell structure is combined with the permanent, long life time storage capability of the non-volatile ROM floating gate memory cell structure. The individual memory cells in the storage matrix may be utilized as either a RAM type of storage cell or a ROM type of storage cell; such a selective type of memory storage cell may be conveniently referred to as a programmable random access memory (PRAM).

Each individual cell of the PRAM matrix, which matrix may take the standard form of a multiple cell array such as a 32 × 32 or 1024 cell array, comprises a write transistor, a read transistor, a RAM storage transistor, and a ROM floating gate storage transistor. In one preferred form of PRAM cell structure the drain to source circuit of a RAM storage transistor is coupled in parallel with the drain to source circuit of a floating gate ROM storage transistor. The parallel drain to source circuits of these two transistors are coupled in series with the drain to source circuit of the read transistor while the gate of the RAM storage transistor is connected in series to the drain to source circuit of the write transistor. Sense amplifiers which, as in the case of known RAM memory structures, are common to groups of memory cells, are coupled between the outputs of the PRAM memory cells and the inputs of the memory cells, i.e., to the drain to source circuit of the write transistor. These sense amplifiers operate when the PRAM memory cell is utilized for RAM memory storage to re-enhance in a cyclical manner the signal stored in the RAM storage transistor within the cell life-time, i.e., within every 2.0 milliseconds as with the conventional RAM storage structure.

The novel PRAM cell may be employed in the RAM mode of operation by applying a turn-on decode signal, i.e., x.w, to the gate of the write transistor to couple the voltage on the input buss to the gate of the RAM storage transistor and thus store a charge in the inherent capacitor between the gate and substrate of the RAM transistor. No charge storage is made in the ROM storage transistor and the cell will thereafter operate in the same manner as a conventional known type of RAM storage cell. The information stored in the RAM transistors in the various storage cells may be rapidly and easily altered as with the conventional RAM cell structure by operation of the write transistor to store a zero or one logic charge in the RAM storage transistor.

Where the PRAM memory cell is to be utilized as a ROM type of memory cell, during the write in period the read transistor is turned on to provide a low impedance path from a pulse power voltage source to the parallel connected drain-source circuits of the RAM type storage transistor and the ROM type of storage transistor. This high power pulse has no effect on the RAM storage transistor but results in a charge being stored on the floating gate of the ROM storage transistor. This stored charge, as with the standard known ROM memory cells, has a half-life time of 10 years and is for all intents and purposes a permanent storage not readily changed. As with the standard ROM memory structures, it takes about 100 milliseconds to program the ROM memory cells and takes about five minutes to erase the storage in the ROM transistors with ultraviolet light.

Several different circuit configurations for the ROM type transistor and the RAM type transistor within the novel PRAM memory cell structure are disclosed.

BRIEF DESCRIPTION OF THE DRAWINGS

FIG. 3 is a schematic diagram of another form of PRAM memory cell made in accordance with the present invention.

FIG. 4 is a cross section view of an integrated circuit showing a four-transistor memory cell structure of the type used in FIG. 3.

FIG. 5 is a schematic diagram of still another PRAM memory cell embodiment of the present invention.

FIG. 6 is a cross section view of an integrated circuit showing a four-transistor memory cell structure of the type used in FIG. 5.

DESCRIPTION OF THE PREFERRED EMBODIMENTS

Figure 1:
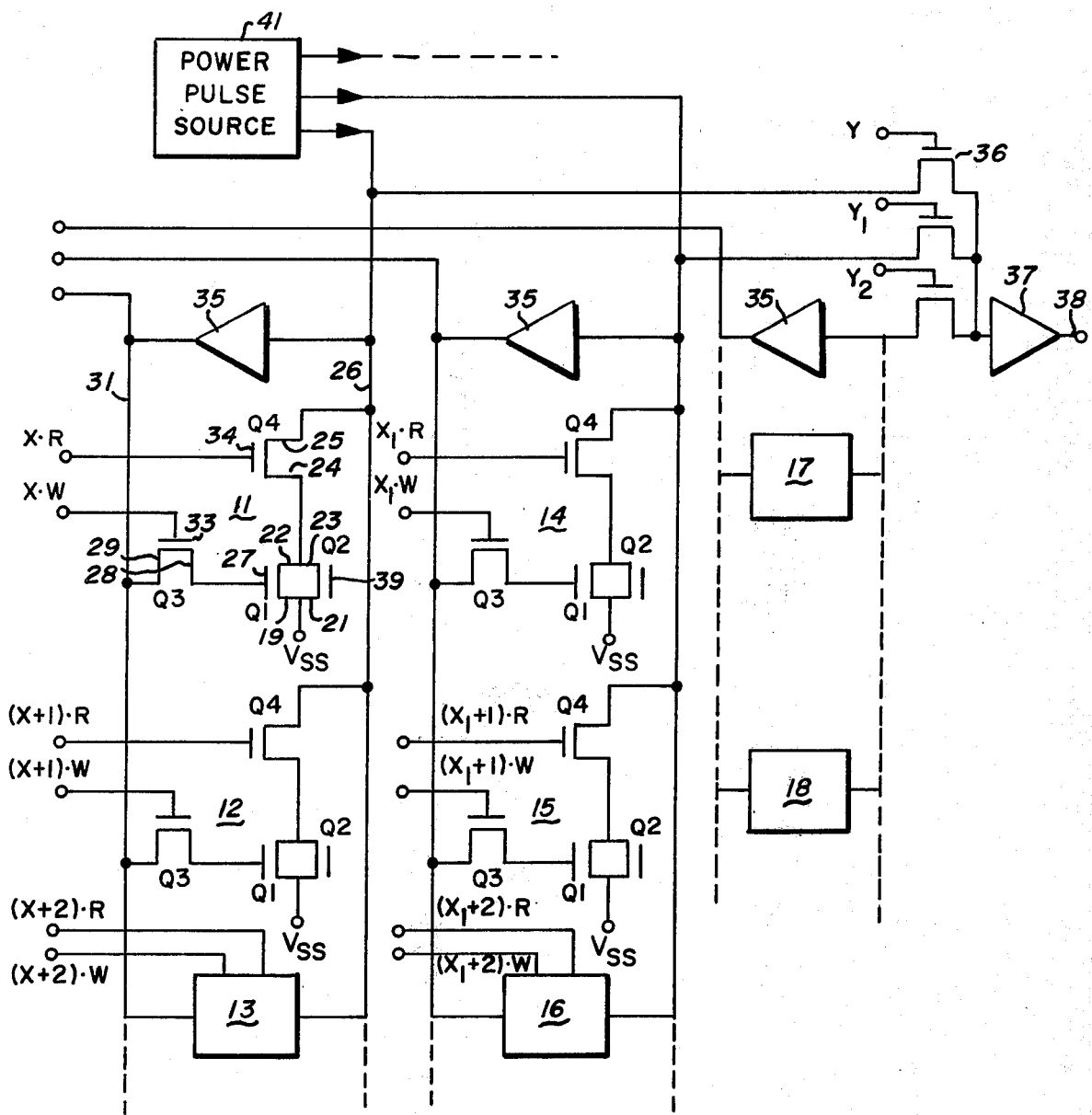
FIG. 1 is a schematic diagram showing four PRAM memory cells in a memory matrix structure made in accordance with the present invention.

Referring now to FIG. 1 a typical memory matrix of the present invention comprises a plurality of individual memory cells including cells 11 through 18 arranged in vertical columns, for example 32 cells in each of the 32 columns making up a 1024 × 1 memory matrix. Each memory cell comprises RAM storage transistor Q1, a ROM floating gate transistor Q2, a write in transistor Q3, and a read transistor Q4. The source 19 of the RAM transistor Q1 is connected to the source 21 of the ROM transistor Q2 while the drain 22 of the RAM transistor Q1 is connected to the drain 23 of the ROM transistor Q2. Thus the drain to souce circuits of the two storage transistors Q1 and Q2 are coupled in parallel. The drains of the two storage transistors are connected to the source 24 of the read transistor Q4, the drain 24 of the read transistor Q4 being coupled to the data output line 26 which is common to all of the memory cells in the first vertical column. The gate 27 of the RAM transistor Q1 is coupled to the drain 28 of the write transistor Q3, the source 29 of the write transistor Q3 being coupled to the input buss bar 31 which is common to all the memory cells in the first vertical column. The gate 33 of the write transistor Q3 is connected to the decode input X·W and the gate 34 of the read transistor Q4 is coupled to the decode input X·R. The data output line 26 for the memory cells in the first vertical column is coupled via a common sense amplifier 35 to the input buss bar 31.

In order to write into the RAM memory cell transistor Q1, the X·W decode signal is applied to the gate 33 of the write transistor Q3, turning this transistor Q3 on and thus establishing a low impedance path from the voltage on the input buss bar 31 to the gate 27 of the RAM transistor Q1. A charge is thus stored in the inherent capacitor existing between the gate 27 and the substrate of the transistor. This signal stored in the RAM transistor Q1 may be read out by applying the proper X·R decode signal to the gate 34 of the read transistor Q4 thus creating a low impedance path from the drain to source circuit of the RAM transistor Q1 to the memory cell output line 26 leading to the drain to source circuit of the associated Y select transistor 36. This output lead 26 is coupled through the Y select transistor 36 to the input of a common output amplifier 37 leading to the array data out line 38. Because of the two millisecond life time for the charge on the gate 27 of the RAM transistor Q1, both the write transistor Q3 and the read transistor Q4 are turned on periodically by suitable signals applied to their gate circuits via the X·W and X·R inputs, respectively, to establish a low impedance path from the drain to source circuit of the RAM transistor Q1 via the drain to source circuit of the read transistor Q4, the sense amplifier 35 and the drain to source circuit of the write transistor Q3 back to the gate of the RAM storage transistor Q1. In this manner the charge on the gate of the RAM storage transistor is continuously enhanced in a cyclical manner within the life time of the charge.

If it is desired that the memory cell be operated in a manner similar to a ROM cell, the read transistor Q4 is turned on via its gate circuit 34 by a decode signal X·R during the write period. The turn on of the read transistor Q4 provides a low impedance path to the drain to source circuit of the floating gate ROM transistor Q2 from a known type of pulse power source 41 associated with the data out line 26. The high voltage pulse applied via the read transistor Q4 results in a charge flowing into and being stored on the floating gate 39 of the ROM transistor Q2 in the cell. After sufficient volt seconds have been accumulated on the floating gate, the charge will remain with a 10 year half-life time after the high voltage pulse has been removed. This charge will remain even if the power to the array is turned off.

If it is desired that one or more of the ROM cells in the vertical column remain uncharged even though all the read transistors Q4 in the column have been turned on, the associated write transistor Q3 may be turned on by a decode signal applied to the X·W input to the gate 33 and this will, in turn, cause the RAM storage transistor Q1 to be turned on. The turned on condition of the RAM storage transistor Q1 in the cell produces a low impedance path for the high voltage pulse from source 41 applied via the write transistor Q4 and the result is that no charge is built up on the floating gate 39 of the ROM transistor Q2 during this write period. The RAM transistor Q1 in this cell may thereafter be programmed so as to have a zero or a one stored therein as desired.

Figure 2:
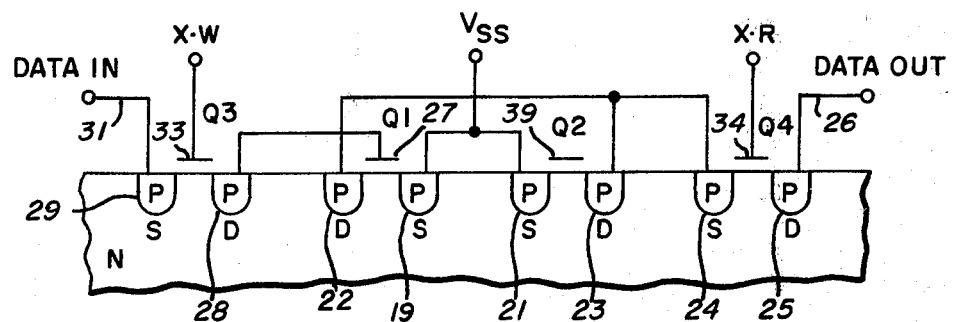
FIG. 2 is a cross section view of an integrated circuit showing one four-transistor memory cell structure of the type utilized in FIG. 1 of the present invention.

Referring to FIG. 2 the integrated circuit structure of each cell shown in the embodiment of FIG. 1 comprises the RAM transistor Q1, the ROM transistor Q2, the write transistor Q3, and the read transistor Q4. The source 29 of write transistor Q3 is coupled to the data in line 31. The gate 33 of write transistor Q3 is connected to the gate 27 of RAM storage transistor Q1. The source regions 19 and 21 of RAM transistor Q1 and floating gate ROM transistor Q2 are coupled together to the $V_{ss}$ voltage source. The drain regions 22 and 23 of both RAM transistor Q1 and ROM transistor Q2 are coupled together to the source region 24 of the read transistor Q4. The drain region 25 of read transistor Q4 is coupled to the data outline 26. The gate 34 of the read transistor Q4 is coupled to the X·R input lead.

Although the cell structure as shown in FIG. 1 is the preferred arrangement, alternate forms of memory cell structures incorporating the present invention are shown in FIGS. 3 and 5. The cell structure of FIG. 3 includes the RAM storage cell Q1, the read transistor Q4, the write transistor Q3 and the ROM storage transistor Q2. In this cell structure, the relationships of transistors Q1, Q2 and Q3 remain the same as the corresponding transistors of the cell structure of FIG. 1. In this alternate cell, however, the source 21' of the storage transistor Q2 is coupled to the $V_{ss}$ while the drain 23' of transistor Q2 is coupled to the gate 27 of transistor Q1. When the cell is to be used as a RAM type of storage, a charge on the gate 27 of Q1 is applied in the normal manner from the input lead 31 via the write transistor Q3 when the transistor Q3 is turned on by the decode signal applied to its gate. When it is desired that the cell be used as a ROM storage cell then, during the write period, with transistor Q3 turned on, a power pulse is applied to transistor Q2 from the power pulse source 41 via the source to drain circuit of transistor Q3 and in response to this high voltage pulse a charge is stored on the floating gate of Q2. Both the storage transistor Q1 and the storage transistor Q2 are read out via the read transistor Q4.

Referring to FIG. 4 the integrated circuit structure of the memory cell shown in the embodiment of FIG. 3 comprises the RAM transistor Q1, the ROM transistor Q2, the write transistor Q3, and the read transistor Q4. The source 29' of write transistor Q3 is coupled to the data in line 31. The gate 33' of write transistor Q3 is coupled to the X·W decode input. The drain 28' of write transistor Q3 is connected to the gate 27' of RAM storage transistor Q1 and to the drain 23' of ROM transistor Q2. The source region 19' and 21' of RAM transistor Q1 and floating gate ROM transistor Q2 are coupled together to the $V_{ss}$ voltage source. The drain region 22' of RAM transistor Q1 is coupled to the source region 24' of the read transistor Q4. The drain region 25' of read transistor Q4 is coupled to the data out line 26. The gate 34' of the read transistor Q4 is coupled to the X·R input lead.

In the memory cell embodiment shown in FIG. 5 the source 21" of the ROM memory transistor Q2 is coupled to the gate 27" of transistor Q1 and the drain 23" of the storage transistor Q2 is coupled to the drain 22" of the storage transistor Q1. In this circuit the storage in the RAM transistor Q1 is made in the ordinary manner by turning on the write transistor Q3. A storage is made in the ROM storage transistor Q2 by applying a line 31 voltage to the source 21" of Q2 via a turned on write transistor Q3 and at the same time turning on the read transistor Q4 and applying a power pulse from source 41 via the transistor Q4 to the drain 23" of transistor Q2. Readout of a storage on either transistor Q1 or transistor Q2 is accomplished by turning on the read transistor Q4 in a normal manner.

Referring to FIG. 6 the integrated circuit structure of the memory cell shown in the embodiment of FIG. 5 comprises the RAM transistor Q1, the ROM transistor Q2, the write transistor Q3, and the read transistor Q4. The source 29" of transistor Q3 is coupled to the data in line 31. The gate 33" of write transistor Q3 is coupled to the X·W decode input. The drain 28" of write transistor Q3 is connected to the gate 27" of RAM storage transistor Q1 and to the source 21" of ROM transistor Q2. The source region 19" of RAM transistor Q1 is coupled to the $V_{ss}$ voltage source. The drain regions 22" and 23" of both RAM transistor Q1 and ROM transistor Q2 are coupled together to the source region 24" of the read transistor Q4. The drain region 25" of read transistor Q4 is coupled to the data out line 26. The gate 34" of the read transistor Q4 is coupled to the X·R input lead.

What is claimed is:

1. An integrated circuit memory structure comprising a plurality of memory cells, each cell having an input and an output, and a sense amplifier having an output coupled to the input of said cells and an input coupled to the output of said cells, each cell comprising, in combination, a write select transistor having a gate coupled to a write select input, a source coupled to the input of said cell, and a drain, a read select transistor having a gate coupled to a read select input, a source, and a drain coupled to the output of said cell, a random access memory transistor having a gate coupled to the drain of said write select transistor, a source coupled to a source of potential, and a drain coupled to the source of said read select transistor, a read only memory transistor having a floating gate, a source, and a drain, means coupling said source and said drain of said read only memory transistor to said random access memory transistor to control conduction in said random access memory transistor in response to the state of charge of said floating gate in said read only memory transistor wherein said coupling means includes means for coupling the drain of said random access memory transistor to the drain of sid read only memory transistor and for coupling the source of said random access memory transistor to the source of said read only memory transistor and pulse power source means coupled to said cell to charge said floating gate in response to the state of conduction in said read select and said write select transistors.

2. An integrated circuit memory cell structure comprising:

a write select transistor having a gate for coupling to a write select input, a source for coupling to the input of said cell, and a drain, a read select transistor having a gate coupling to a read select input, a source, and a drain for coupling to the output of said cell, a random access memory transistor having a gate coupled to the drain of said write select transistor, a source for coupling to a source of potential, and a drain coupled to the source of said read select transistor, and a read only memory transistor having a floating gate, a source coupled to the source of said random access memory transistor, and a drain coupled to the drain of said random access memory transistor.

* * * * *